United States Patent
Jung et al.

(10) Patent No.: US 12,278,128 B2
(45) Date of Patent: Apr. 15, 2025

(54) APPARATUS FOR TRANSFERRING SUBSTRATE, AND APPARATUS AND METHOD FOR TREATING SUBSTRATE

(71) Applicant: SEMES CO., LTD., Cheonan-si (KR)

(72) Inventors: Jinwoo Jung, Seoul (KR); Yong Hee Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 477 days.

(21) Appl. No.: 17/365,165

(22) Filed: Jul. 1, 2021

(65) Prior Publication Data

US 2022/0013393 A1 Jan. 13, 2022

(30) Foreign Application Priority Data

Jul. 9, 2020 (KR) .................. 10-2020-0084891

(51) Int. Cl.
*H01L 21/67* (2006.01)
*H01L 21/673* (2006.01)
*H01L 21/677* (2006.01)

(52) U.S. Cl.
CPC .. *H01L 21/67742* (2013.01); *H01L 21/67023* (2013.01); *H01L 21/67034* (2013.01); *H01L 21/67326* (2013.01); *H01L 21/67745* (2013.01)

(58) Field of Classification Search
None
See application file for complete search history.

(56) References Cited

U.S. PATENT DOCUMENTS

| | | | |
|---|---|---|---|
| 10,453,720 B1* | 10/2019 | Aburatani | H01L 21/67742 |
| 2015/0243536 A1* | 8/2015 | Okada | H01L 21/6715 |
| | | | 134/57 R |
| 2020/0343113 A1* | 10/2020 | Choi | H01L 21/67028 |

FOREIGN PATENT DOCUMENTS

| | | |
|---|---|---|
| JP | 1999330190 | 11/1999 |
| JP | 2001-007065 | 1/2001 |
| JP | 2004-010961 | 1/2004 |
| JP | 2007-005659 | 1/2007 |
| JP | 2013-206957 | 10/2013 |
| JP | 2015159215 | 9/2015 |
| JP | 2017183579 | 10/2017 |
| JP | 2019-068058 | 4/2019 |
| JP | 2019067855 | 4/2019 |

(Continued)

OTHER PUBLICATIONS

English translation of JPH11330190A.*

(Continued)

*Primary Examiner* — Charles Capozzi

(57) ABSTRACT

An apparatus for treating a substrate is provided. The apparatus for treating the substrate includes a first process chamber to perform a liquid treatment process with respect to the substrate, a second process chamber to perform a drying treatment process with respect to the substrate which is liquid treated in the first process chamber, a first hand to introduce the substrate to the first process chamber, before the liquid treatment process is performed, a second hand to withdraw the substrate from the first process chamber after the liquid treatment process is performed and to introduce the substrate into the second process chamber, and a third hand to withdraw the substrate from the second process chamber after the drying treatment process is performed.

10 Claims, 8 Drawing Sheets

(56) References Cited

FOREIGN PATENT DOCUMENTS

| | | |
|---|---|---|
| KR | 1020070056416 | 6/2007 |
| KR | 1020140037429 | 3/2014 |
| KR | 1020040083706 | 10/2014 |
| KR | 101757819 | 7/2017 |
| KR | 1020170113354 | 10/2017 |
| KR | 1020170137240 | 12/2017 |
| KR | 10-2018-0127763 | 3/2019 |
| WO | 2010103876 | 9/2010 |

OTHER PUBLICATIONS

Decision of Rejection from Japan Patent Office dated Mar. 14, 2023.
Office Action from the Japan Patent Office dated Aug. 9, 2022.

\* cited by examiner

APPARATUS FOR TRANSFERRING SUBSTRATE, AND APPARATUS AND METHOD FOR TREATING SUBSTRATE

CROSS-REFERENCE TO RELATED APPLICATIONS

This application claims priority under 35 U.S.C. § 119 to Korean Patent Application No. 10-2020-0084891 filed on Jul. 9, 2020, in the Korean Intellectual Property Office, the disclosures of which are incorporated by reference herein in their entireties.

BACKGROUND

Embodiments of the present disclosure described herein relate to an apparatus for transferring a substrate, and an apparatus and a method for treating a substrate.

SUMMARY

In general, integrated circuit devices, such as a semiconductor device, may be manufactured by repeatedly performing a series of unit processes with respect to a semiconductor substrate used as the substrate. For example, electrical circuit patterns constituting the integrated circuit devices may be formed on the substrate by performing unit processes such as a depositing process, a photolithography process, an etching process, a cleaning process, and a drying process, Among the unit processes, the etching or cleaning may be performed by a single-type apparatus for treating a single substrate and a batch-type apparatus for simultaneously treating a plurality of substrates. In particular, the single-type apparatus may process the substrate by supplying an etching solution, a cleaning solution, a rinse solution, or drying gas onto the substrate while spinning the substrate.

However, recently, as line widths of the circuit patterns are reduced, it has increasingly been difficult to apply a spin dry manner of spinning the substrate at a higher speed. This is because fine circuit pattern may be damaged due to centrifugal force which is generated as the substrate is spun at a higher speed.

To solve the above problems, a drying manner using a supercritical fluid instead of spinning the substrate at a higher speed has recently been employed. In detail, a substrate is positioned in a sealed pressure vessel, and a higher-pressure supercritical fluid is injected into the pressure vessel, thereby drying the substrate through a manner of replacing a liquid on the substrate with the supercritical fluid.

When the drying manner is applied, an apparatus for treating the substrate may include a first module to perform an etching process or a cleaning process and a second module to dry the substrate. When the substrate is moved from the first module to the second module, the substrate is transferred in the state that the surface of the substrate is coated with a wet solution, thereby preventing the natural dry of the substrate.

However, a substrate transfer robot to transfer the substrate has to transfer the substrate from the first module to the second module using any one of a hand to transfer a pretreatment substrate and a hand to transfer a post-treatment substrate. In this process, the hand may be contaminated with the wet solution coated on the surface of the substrate.

Embodiments of the present disclosure provides an apparatus for transferring a substrate, and an apparatus and a method for treating the substrate, capable of preventing the substrate from being contaminated in the process of transferring the substrate to clean the substrate.

The objects which will be achieved in the present disclosure are not limited to the above, but other objects, which are not mentioned, will be apparently understood to those skilled in the art.

According to an embodiment, there may be provided an apparatus for fabricating a semiconductor device, which includes a first process chamber to perform a liquid treatment process on a substrate, a second process chamber to perform a drying treatment process on the substrate, which is the liquid treatment process in the first process chamber, a substrate transfer robot including a first hand to introduce the substrate to the first process chamber, before the liquid treatment process is performed, a second hand to withdraw the substrate from the first process chamber after the liquid treatment process is performed and to introduce the substrate into the second process chamber, a third hand to withdraw the substrate from the second process chamber after the drying treatment process is performed, and a controller controlling the first hand, the second hand, and the third hand. The controller controls the second hand to transfer the substrate at a lower speed than a speed of transferring the substrate by the first hand or the third hand.

According to an embodiment, the substrate transfer robot further includes a body to which the first hand, the second hand, and the third hand may be provided.

According to an embodiment, the second process chamber may be a high pressure chamber to perform the drying treatment process on the substrate transferred from the first process chamber, by using a supercritical fluid.

According to an embodiment, the second hand may transfer the substrate having a surface, which is coated with a wetting solution in the first process chamber, to the second process chamber.

According to an embodiment, the wetting solution may include a volatile organic solvent, pure water, or a mixture of a surfactant and pure water.

According to an embodiment, the third hand, the first hand, and the second hand may be disposed at different heights in a vertical direction on the body.

According to an embodiment, the first hand may be disposed above the second hand.

According to an embodiment, the third hand may be disposed above the first hand.

According to an embodiment, the apparatus further includes a transfer chamber disposed at one side of each of the first process chamber and the second process chamber. The first hand and the third hand may be provided in the transfer chamber. The second hand may be provided in a space between the first process chamber and the second process chamber.

According to an embodiment, there may be provided an apparatus for fabricating a semiconductor device, which includes a body, a first hand disposed on the body, a second hand disposed on the body, a third hand disposed on the body, and a controller to control individually driving of each of the first hand to the third hand. The controller may control the first hand to transfer a substrate before a liquid treatment process is performed, control the third hand to transfer the substrate after a drying treatment process is performed, and control the second hand to transfer the substrate having a surface coated with a wetting solution.

According to an embodiment, the controller may control the second hand to transfer the substrate at a speed lower than a speed of transferring a substrate by the first hand or the third hand.

According to an embodiment, the third hand, the first hand, and the second hand may be disposed at different heights in a vertical direction on the body.

According to an embodiment, the first hand may be disposed above the second hand, and may be disposed below the third hand.

According to an embodiment, there may be provided an apparatus for fabricating a semiconductor device, which includes a process treating unit to treat a substrate, and an index unit including a load port on which a substrate transferring container having the substrate received therein is placed, and an index robot to transfer the substrate between the substrate transferring container and the process treating unit. The process treating unit includes a transfer chamber having a substrate transfer apparatus to transfer the substrate to a destination and disposed adjacent to the index unit, a first process chamber disposed at a side portion of the transfer chamber to perform a liquid treatment process on the substrate, and a second process chamber to perform, by using a supercritical fluid, a drying treatment process on the substrate after the liquid treatment process is performed. The substrate transfer apparatus may include a first hand to transfer the substrate to the first process chamber before the liquid treatment process is performed, a second hand to transfer the substrate, which is coated with a wetting solution in the first process chamber, to the second process chamber, and a third hand to transfer the substrate which is dried in the second process chamber.

According to an embodiment, the first hand may be disposed above the second hand, and may be disposed below the third hand.

According to an embodiment, a controller to control the substrate transfer apparatus is further included. The controller may control the second hand to transfer the substrate at a speed lower than the speed of transferring a substrate by the first hand or the third hand.

According to another embodiment, there may be provided a method for treating a substrate, which includes introducing the substrate into a first process chamber by using a first hand, coating a wetting solution on the substrate in the first process chamber, transferring the substrate, which is coated with the wetting solution, to a second process chamber, which is to dry the substrate, by using a second hand, performing a drying treatment process with respect to the substrate coated with the wetting solution in the second process chamber, and withdrawing the substrate, which is subject to the drying treatment process, from the second process chamber by using a third hand.

According to an embodiment, in the performing of the drying treatment process, the substrate may be subject to the drying treatment process by using a supercritical fluid.

According to an embodiment, the wetting solution may include a volatile organic solvent (e.g., isopropyl alcohol, isopropyl alcohol aqueous solution), pure water, or a mixture of a surfactant and pure water.

According to an embodiment, transferring of the substrate by using the second hand may be performed at a lower speed than a speed of transferring the substrate by the first hand or the third hand.

According to an embodiment, the first hand, the second hand, and the third hand may be provided to a body of one substrate transfer apparatus.

As described above, according to an embodiment of the present disclosure, the hand to transfer the wet substrate may be separately provided such that the substrate is prevented from being contaminated in the procedure of transferring the substrate.

The effects produced in the disclosure are not limited to the aforementioned effects, and any other effects not mentioned herein will be clearly understood from the detailed description and accompanying drawings by those skilled in the art to which the present disclosure pertains.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
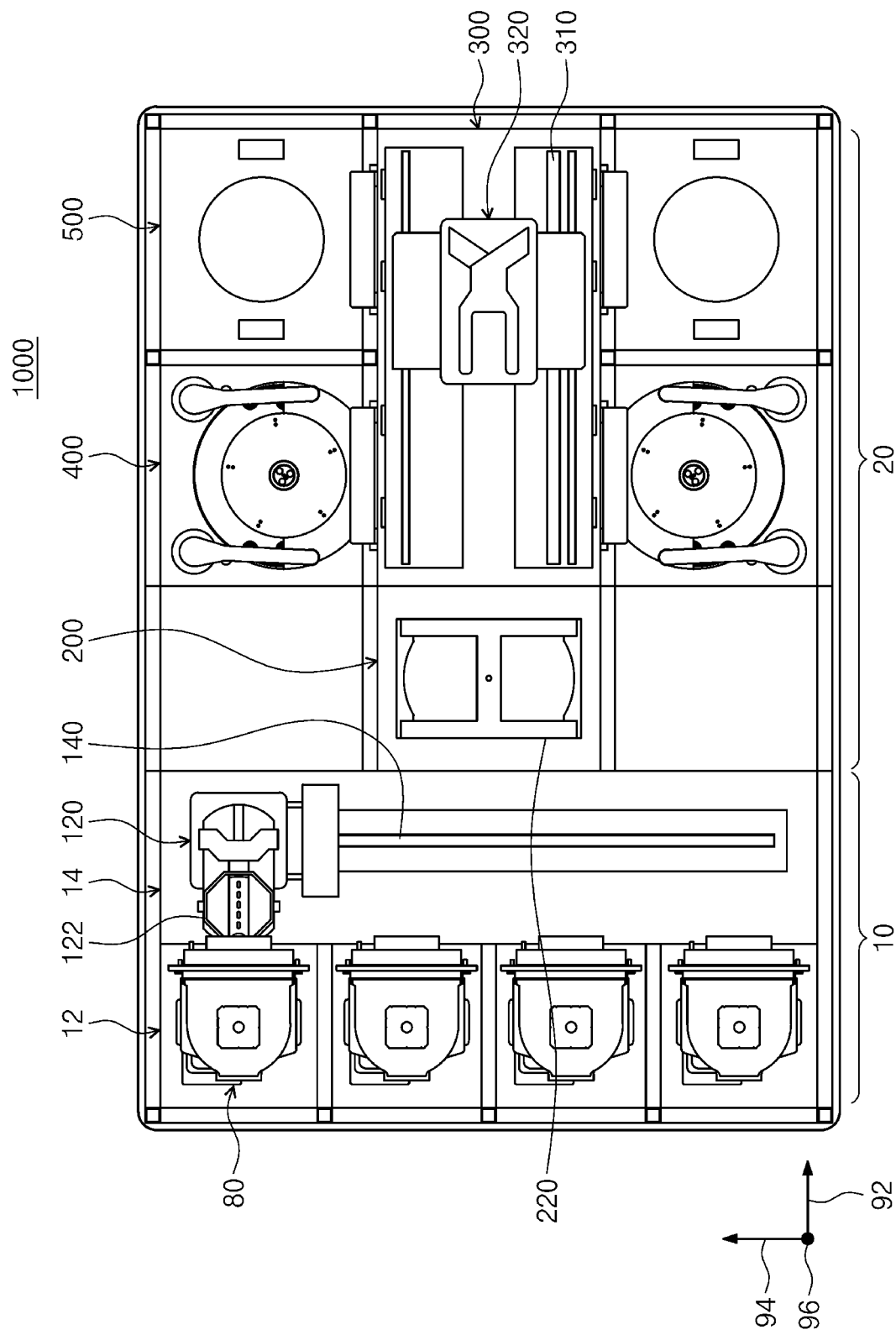
FIG. 1 is a view schematically illustrating an apparatus for treating a substrate, according to an embodiment of the present disclosure.

Hereinafter, an embodiment of the present disclosure will be described in more detail with reference to the accompanying drawings. The embodiments of the present disclosure may be modified in various forms, and the scope of the present disclosure should not be construed to be limited by the embodiments of the present disclosure described in the following. The present embodiment is provided to describe the present disclosure for those skilled in the art more completely. Accordingly, the shapes of the components in the drawings are exaggerated to emphasize clearer descriptions.

Hereinafter, an apparatus (hereinafter, a "substrate treating apparatus") for treating a substrate will be described according to the present disclosure.

The substrate treating apparatus may perform a process of cleaning the substrate using a cleaning solution and a drying process of drying the substrate using a supercritical fluid (or isopropyl alcohol (IPA)) as a process fluid.

In this case, the substrate is a comprehensive concept including all of a semiconductor device, a flat panel display, and a substrate including a thin film having a circuit pattern and used to manufacture an article. For example, the substrate 'W' includes a silicon wafer, a glass substrate, and an organic substrate.

FIG. 1 is a view schematically illustrating a substrate treating apparatus, according to an embodiment of the present disclosure.

Referring to FIG. 1, a substrate treating apparatus 1000 may include an index unit 10 and a process treating unit 20.

According to an embodiment, the index unit 10 and the process treating unit 20 may be arranged in one direction. Hereinafter, a direction in which the index unit 10 and the process treating unit 20 are arranged will be referred to as a first direction 92, a direction that is perpendicular to the first direction 92 when viewed from above will be referred to as a second direction 94, and a direction perpendicular to all the first direction 92 and the second direction 94 will be referred to as a third direction 96.

The index unit 10 transfers a substrate 'W' to the process treating unit 20 from a container 80 having the substrate 'W' received therein, and a substrate 'W' completely treated in the process treating unit 20 is received into the container 80. The longitudinal direction of the index unit 10 is provided in the second direction 94. The index unit 10 has a load port 12 and an index frame 14. The load port 12 is positioned at an opposite side of the process treating unit 20, based on the index frame 14. The container 80 having substrates 'W' received therein are placed on the load port 12. A plurality of load ports 12 may be provided and may be arranged in the second direction 94.

The container 80 may include a container 10 for sealing such as a front open unified pod (FOUP). The container 80 may be placed on the load port 12 by a transport unit (not illustrated) such as Overhead Transfer, Overhead Conveyor, or Automatic Guided Vehicle, or a worker.

An index robot 120 is provided inside the index frame 14. A guide rail 140, which has a longitudinal direction provided in the second direction 94, may be provided in the index frame 14, and the index robot 120 may be provided to be movable on the guide rail 140 The index robot 120 may include a hand 122 in which the substrate 'W' is positioned, and the hand 122 may be provided to be movable forward and backward, rotatable about the third direction 96, and movable in the third direction 96. A plurality of hands 122 are spaced apart from each other in a vertical direction, and are individually movable forward and rearward.

The process treating unit 20 includes a buffer chamber 200, a transfer chamber 300, a first process chamber 400, and a second process chamber 500.

The buffer chamber 200 provides a space to temporarily stay the substrate 'W' carried between the index unit 10 and the process treating unit 20. A buffer slot may be provided in the buffer chamber 200. The substrate 'W' is placed in the buffer slot. For example, the index robot 120 may withdraw the substrate 'W' from the container '80' and place the substrate 'W' in the buffer slot. A substrate transfer robot 320 of the transfer chamber 300 may withdraw the substrate 'W' from the buffer slot and may transfer the substrate 'W' to the first process chamber 400 or the second process chamber 500. A plurality of buffer slots may be provided in the buffer chamber 200 to place a plurality of substrates 'W'.

The transfer chamber 300 transfers the substrate 'W' between any two of the buffer chamber 200, the first process chambers 400, and the second process chamber 500 which are disposed around the transfer chamber 300. The transfer chamber 300 includes the substrate transfer robot 320 and a transfer rail 310. The substrate transfer robot 320 moves on the transfer rail 310 and may transfer the substrate 'W'.

The first process chamber 400 and the second process chamber 500 may perform a cleaning process by using a process fluid. The cleaning process may be sequentially performed in the first process chamber 400 and the second process chamber 500. For example, the cleaning process is performed in the first process chamber 300 and the drying process may be performed in the second process chamber 500 by using a supercritical fluid (or IPA).

The first process chamber 400 and the second process chamber 500 may be disposed on side surfaces of the transfer chamber 300. For example, the first process chamber 400 and the second process chamber 500 may be disposed to face at opposite sides of the transfer chamber 300. A plurality of first process chambers 400 and a plurality of second process chambers 500 may be provided. The plurality of process chambers 400 and 500 may be aligned in line on a side surface of the transfer chamber 300.

The alignment of the first process chamber 400 and the second process chamber 500 is not limited to the above-described example, and may be changed in consideration of the footprint or process efficiency of the substrate treating apparatus 1000. The substrate treating apparatus 1000 may be controlled by a controller.

The transfer chamber 300 is disposed such that the longitudinal direction thereof is provided in the first direction 92. The transfer chamber 320 has the substrate transfer robot 320. A guide rail 310, which has a longitudinal direction provided in the first direction 92, may be provided in the transfer chamber 300, and the substrate transfer robot 320 may be provided to be movable on the guide rail 340.

The substrate transfer robot 320 may include a hands 322 in which the substrate 'Iv' is positioned, and the hands 322 may be provided to be movable forward and backward, rotatable about the third direction 96, and movable in the third direction 96. A plurality of hands 322 are spaced apart from each other in the vertical direction, and are individually movable forward and rearward.

Figure 2:
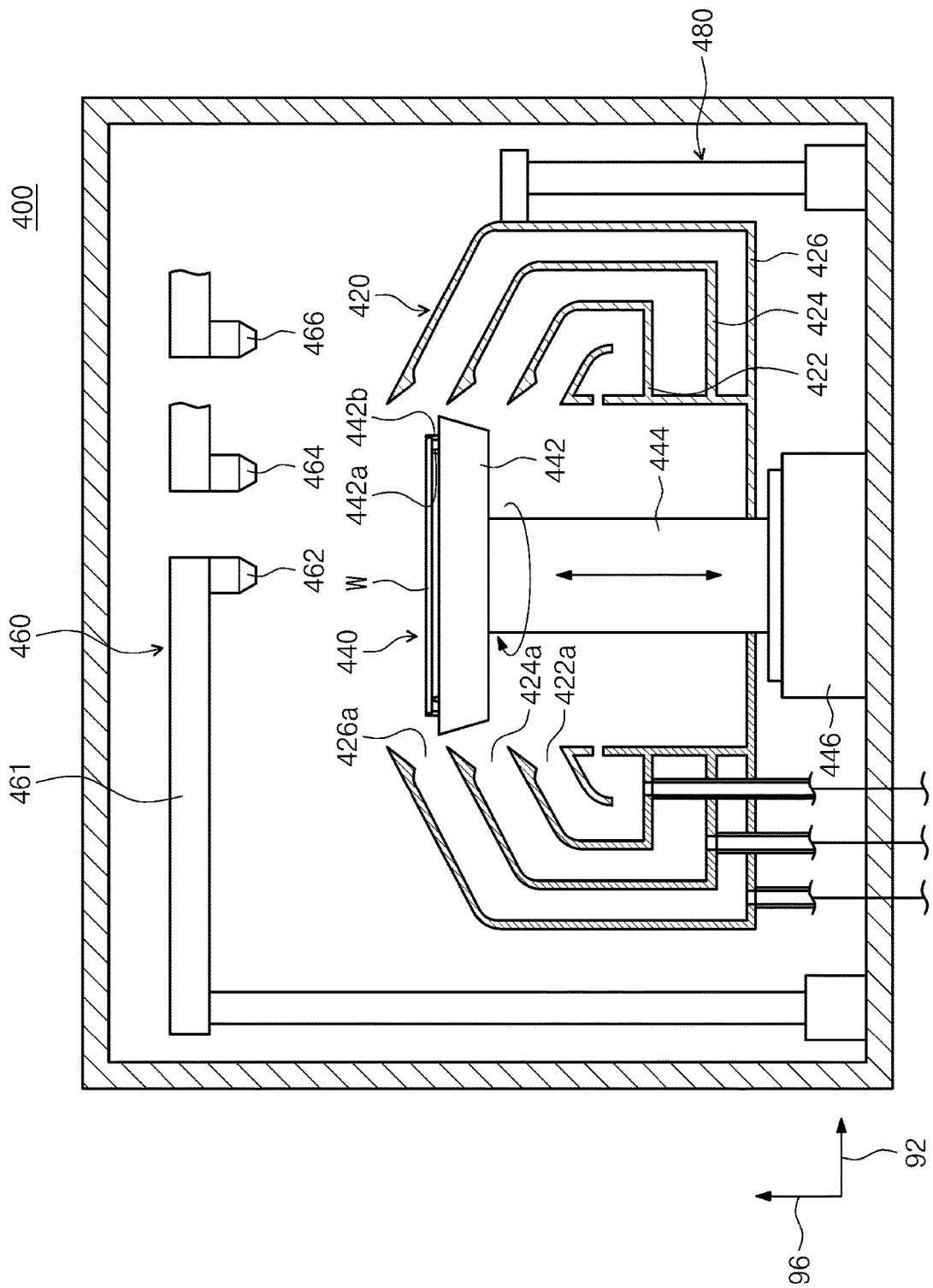
FIG. 2 is a view schematically illustrating a first process chamber of FIG. 1, according to an embodiment.

FIG. 2 is a view schematically illustrating a first process chamber of FIG. 1, according to an embodiment.

Referring to FIG. 2, the first process chamber 400 includes a housing 410, a cup 420, a support unit 440, a liquid supply unit 460, and an elevating unit 480.

The housing 410 substantially has a rectangular parallelepiped shape. The cup 420, the support unit 440, and the liquid supply unit 460 may be provided in the housing 410.

The cup 420 has a treatment space having an open upper portion, and the substrate 'W' is liquid-treated in the treatment space. The support unit 440 is provided in the treatment space to support the substrate 'W'. The liquid supply unit 460 supplies a liquid to the substrate 'W' supported by the support unit 440. Multiple types of liquids may be provided, and sequentially provided onto the substrate 'W'. The elevating unit 480 may adjust the relative height between the cup 420 and the support unit 440.

According to an embodiment, the cup 420 has a plurality of recovery tubs 422, 424, and 426. Each of the recovery tubs 422, 424, and 426 has a recovery space to recover a liquid used to treat the substrate. Each of the recovery tubs 422, 424, and 426 is provided in the shape of a ring to surround the support unit 440. When the liquid treatment process is performed, a pretreatment liquid scattered by the rotation of the substrate 'W' is introduced into the recovery space through inlets 422a, 424a, and 426a of the recovery tubs 422, 424, and 426. According to an embodiment, the cup 420 has a first recovery tub 422, a second recovery tub 424, and a third recovery tub 426. The first recovery tub 422 is disposed to surround the support unit 440, the second recovery tub 424 is disposed to surround the first recovery tub 422, and the third recovery tub 426 is disposed to surround the second recovery cover 424. A second inlet 424a to introduce a liquid into the second recovery tub 424 is positioned above a first inlet 422a to introduce the liquid to the first recovery tub 422, and a third inlet 426*a* to introduce the liquid into the third recovery tub 426 may be positioned above the second inlet 424*a*.

The support unit 440 has a support plate 442 and a driving shaft 444. A top surface of the support plate 442 may be provided in a substantially disk shape, and may have a diameter greater than that of the substrate 'W'. The support plate 442 is provided at the central portion thereof with a support pin 442*a* to support a rear surface of the substrate 'W', and the support pin 442*a* has an upper end protruding from the support plate 442 such that the substrate 'W' is spaced apart from the support plate 442 by a specific distance. The support plate 442 has a chuck pin 442*b* provided at the edge thereof. The chuck pin 442*b* is provided to protrude upward from the support plate 442 to support the side portion of the substrate 'W', thereby preventing the substrate 'W' from being separated from the support unit 440 when the substrate 'W' is spun. The driving shaft 444 is driven by a driver 446 and connected to the central portion of a bottom surface of the substrate 'W' to rotate the support plate 442 about the central axis thereof.

According to an embodiment, the liquid supply unit 460 may include a first nozzle 462, a second nozzle 464, and a third nozzle 466. The first nozzle 462 may supply a first liquid onto the substrate 'W'. The first liquid may be a liquid that removes a film or foreign matters remaining on the substrate 'W'. The second nozzle 464 may supply a second liquid onto the substrate 'W'. The second liquid may be a liquid that is excellently soluble in a third liquid. For example, the second liquid may be a liquid that is more excellently dissolved in a third liquid rather than the first liquid. The second liquid may be a liquid that neutralizes the first liquid supplied on the substrate 'W'. In addition, the second liquid may be a liquid that neutralizes the first liquid and may be more excellently dissolved in the third liquid rather than the first liquid. According to an embodiment, the second liquid may be pure water (de-ionized water; DIW). The third nozzle 466 may supply the third liquid onto the substrate 'W'. The third liquid may be a liquid that is excellently dissolved in the supercritical fluid used in the second process chamber 500. According to an example, the third liquid (wetting solution) may be a volatile organic solvent, pure water, or a mixture of a surfactant and pure water. The organic solvent may be IPA. According to an example, the supercritical fluid may be carbon dioxide. The substrate is withdrawn from the first process chamber in the state that the substrate is coated with the third liquid (wet state) and loaded into the second process chamber.

The first nozzle 462, the second nozzle 464, and the third nozzle 466 are supported on arms 461 different from each other, and the arms 461 may be moved independently. Alternatively, the first nozzle 462, the second nozzle 464, and the third nozzle 466 may be mounted on the same arm and moved.

The elevating unit 480 moves the cup 420 in the vertical direction. The relative height between the cup 420 and the substrate 'W' is changed through the vertical movement of the cup 420. Accordingly, since the recovery tubs 422, 424, and 426 to recover the pretreatment liquid are changed depending on the type of liquids supplied to the substrate 'W', liquids may be separated and recovered. As described above, the cup 420 may be fixedly installed, and the elevating unit 480 may move the support unit 440 in the vertical direction.

Figure 3:
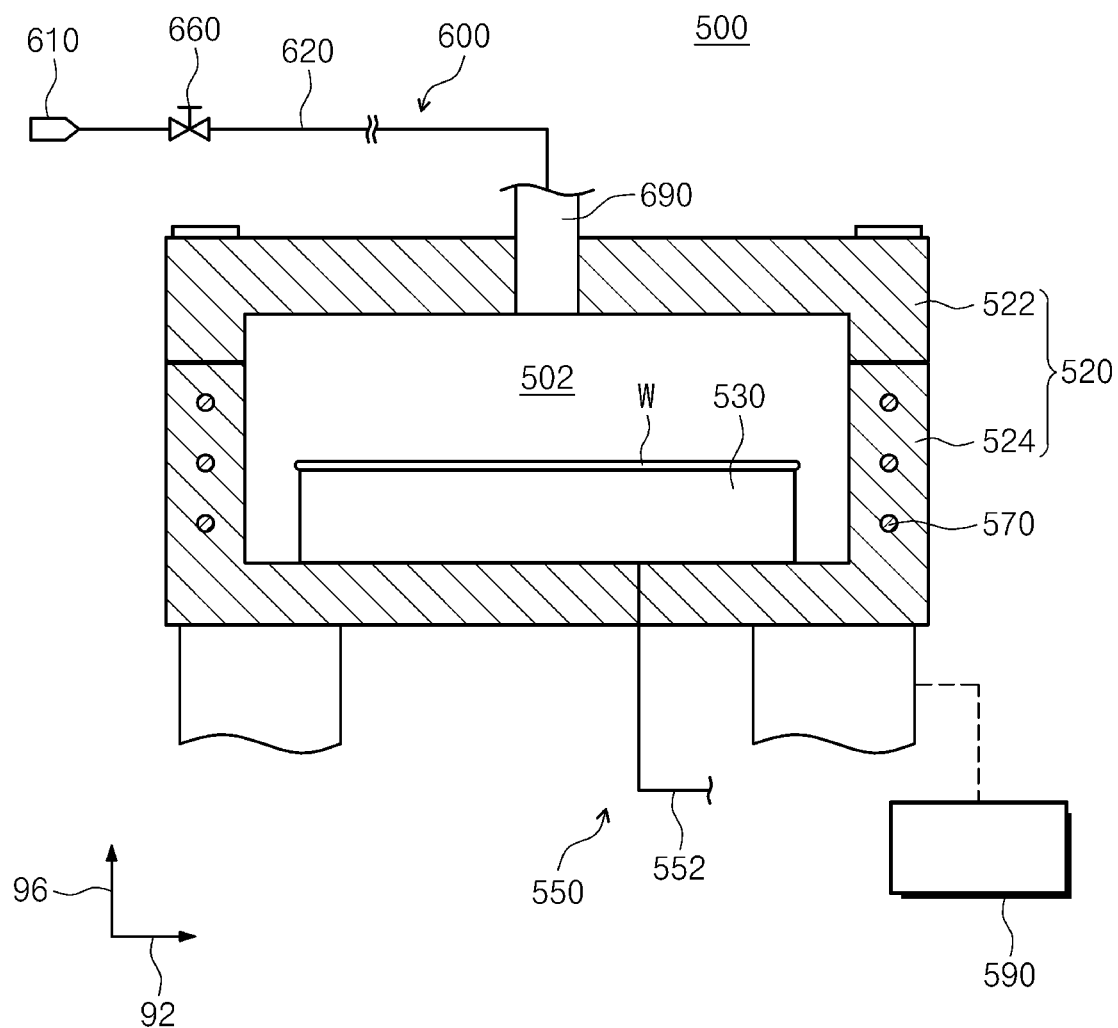
FIG. 3 is a view schematically illustrating a second process chamber of FIG. 1, according to an embodiment.

FIG. 3 is a view schematically illustrating a second process chamber of FIG. 1, according to an embodiment.

According to an embodiment, the second process chamber 500 is to remove the liquid from the substrate 'W' using the supercritical fluid. The second process chamber 500 may include a body 520, a substrate support structure 530, and a fluid supply unit 600.

The body 520 provides a treatment space 502 to perform the cleaning process. The body 520 has an upper body 522 and a lower body 524, and the upper body 522 and the lower body 524 are combined with each other to provide the above-described treatment space 502. The upper body 522 is provided at an upper portion of the lower body 524. The position of the upper body 522 is fixed and the lower body 524 may be moved up and down by a driving member 590 such as a cylinder. When the lower body 524 is spaced apart from the upper body 522, the treatment space 502 is open. In this case, the substrate 'W' is introduced or withdrawn. When the drying process is performed, the lower body 524 makes contact with the upper body 522 to seal the treatment space 502 from the outside.

The second process chamber 500 may include a heater 570. According to an embodiment, the heater 570 may be provided inside a wall of the body 520. The heater 570 heats the treatment space 502 of the body 520 such that the fluid supplied into the inner space of the body 520 is maintained in a supercritical state. The inner part of the treatment space 502 has an atmosphere formed by the supercritical fluid.

The substrate support structure 530 supports the substrate 'Iv' in the treatment space 502 of the body 520.

The fluid supply unit 600 supplies the cleaning fluid to the treatment space 502 of the body 520. According to an embodiment, the cleaning fluid may be supplied, in the supercritical state, to the treatment space 502 Alternatively, the cleaning fluid may be supplied, in a gas state, to the treatment space 502, and may be phase-shifted to the supercritical state in the treatment space 502.

According to an embodiment, the fluid supply unit 600 includes a fluid supply port 690, a supply line 620, and a valve 660. The fluid supply port 690 directly supplies a supercritical fluid to the top surface of the substrate 'W'. The fluid supply port 690 is provided connected to the upper body 522. The fluid supply unit 600 may further include a lower fluid supply port (not illustrated) connected to the lower body 524. The supercritical fluid sprayed from the fluid supply port 690 reaches the central area of the substrate 'W' and spreads to the edge area while being uniformly provided to the whole area of the substrate 'W'. The supply line 620 is connected to the fluid supply port 690. The supply line 620 receives the supercritical fluid from a supercritical fluid storage unit 610, which is separately provided, to the outside and supplies the supercritical fluid to the fluid supply port 690. For example, the supercritical fluid storage unit 610 stores a supercritical fluid, which is carbon dioxide, and supplies the supercritical fluid to the supply line 620.

The valve 660 is mounted on the supply line 620. The valve 660 regulates an amount of the supercritical fluid supplied to the fluid supply port 690. The valve 660 may control an amount of a fluid supplied to the treatment space 502 by the controller.

An exhaust member 550 exhausts the supercritical fluid from the second process chamber 500. The exhaust member 550 may be connected to an exhaust line 552 that exhausts the supercritical fluid. In this case, a valve (not illustrated) for regulating an amount of the supercritical fluid exhausted to the exhaust line 552 may be mounted on the exhaust member 550. The supercritical fluid exhausted through the exhaust line 552 may be released into the atmosphere or supplied to a supercritical fluid regeneration system (not illustrated). The exhaust member 550 may be coupled to the lower body 524.

Figure 4:
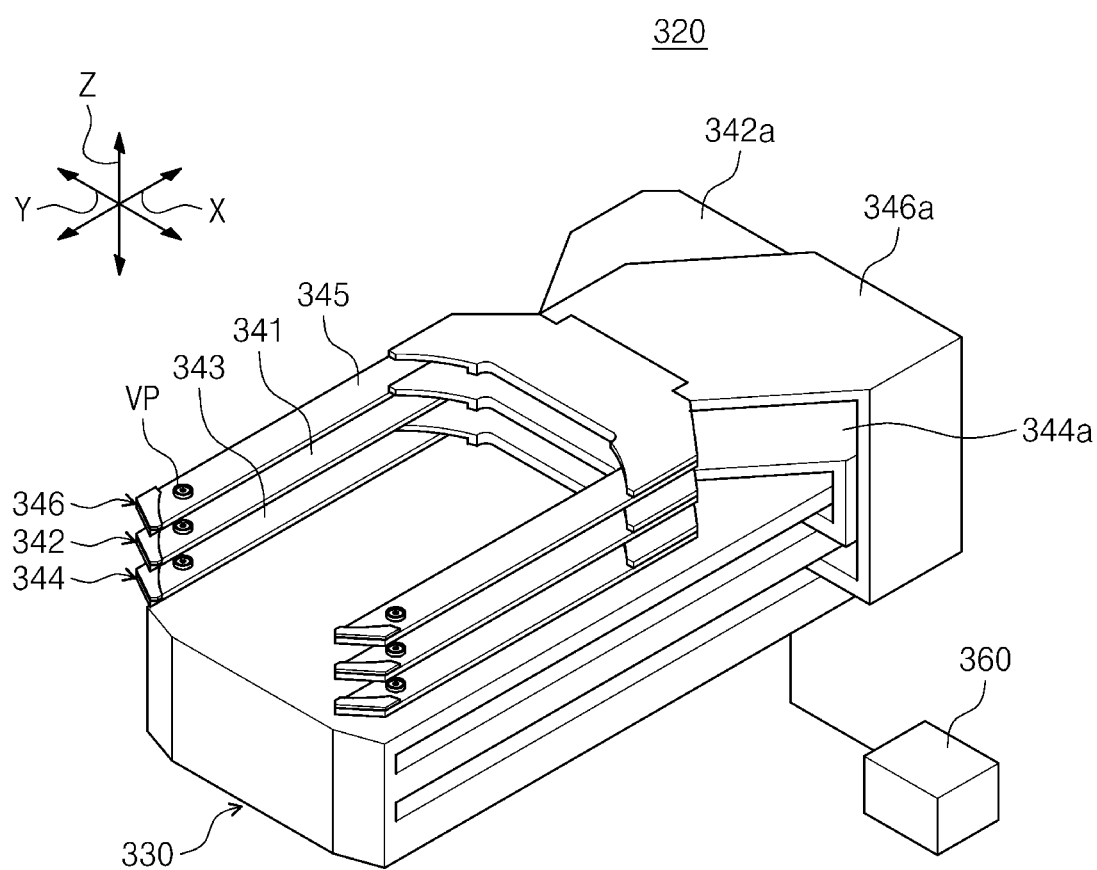
FIG. 4 is a view illustrating an apparatus for transferring a substrate illustrated in FIG. 1.

FIG. 4 is a view illustrating an apparatus for transferring a substrate illustrated in FIG. 1.

Referring to FIG. 4, an apparatus (substrate transfer robot; substrate transfer apparatus) 320 for transferring a substrate includes a body 330, and a first arm 342 to a third arm 346. First, in the drawing, a first direction "X" refers to a movement direction (that is, a forward and backward (horizontal) movement direction) of the first arm 342 to the third arm 346, the second direction "Z" refers to a stacking direction (or vertical movement direction) of the first arm 342 to the third arm 346, and the third direction "Y" refers to a direction (that is, a leftward and rightward (horizontal direction) perpendicular to the first direction "X" and the second direction "Z".

The first arm 342 to the third arm 346 may be stacked on the body (that is, in the second direction z), and may be individually driven. The first arm 342, the second arm 344, and the third arm 346 include a first hand 341, a second hand 343, and a third hand 345, respectively. The first arm, 342, the second arm 344, and the third arm 346 include a first arm base 342a, a second arm base 344a, and a third arm base 346a. The hands 341, 343, and 345 are mechanically connected with arm driving units (not illustrated) through the arm bases 342a, 344a, and 346a. The first arm 342 including the first hand 341 may be disposed between the second arm 344 including the second hand 343 and the third arm 346 including the third hand 345. In an embodiment, the first hand 341 may be connected to the first arm base 342a using a first connector C1, the second hand 343 may be connected to the second arm base 344a using a second connector C2, and the third hand 345 may be connected to the third arm base 346a using a third connector C3. In an embodiment, the first hand 341 and the first arm base 342a may be integrally formed, the second hand 343 and the second arm base 344a may be integrally formed, and the third hand 345 and the third arm base 346a may be integrally formed.

The third hand 345 may be referred to as a withdrawing hand which transfers the substrate after a drying process is completed. The first hand 341 may be referred to as an introducing hand which transfers the substrate before a process treatment (e.g., a cleaning process) is performed. The second hand 343 may be referred to as a transferring hand which transfers the wet substrate for transferring the wet substrate for a drying process. According to an embodiment of the present disclosure, the third hand 345 is positioned above the first hand 341 and the second hand 343, and the second hand 343 is positioned below the first hand 341. In other words, the second hand 343 is disposed at the lowest position to prevent other hands from being contaminated with a wetting solution, because the wetting solution may be dropped by a fan filter unit (FFU; not illustrated) inside the equipment and gravity when the second hand 343 transfers the wet substrate. In addition, the first hand 341 for transferring the substrate before the process treatment (e.g., a cleaning process) is performed is placed in a middle position between the second arm 344 and the third arm 346 because a contaminated substrate in the previous process is introduced for cleaning, and the third hand 345 in the cleanest state is placed in the upper most position.

Accordingly, the substrate transfer robot 320 may prevent the substrate from being contaminated with the wetting solution of the wet substrate in the process of transferring a substrate after the process treatment or a substrate before the process treatment.

Meanwhile, the first hand 341 to the third hand 345 may transfer a substrate while holding the substrate in a vacuum manner. To this end, the hands 341, 343, and 345 may include a vacuum pad (VP). The vacuum pad VP may be formed of a resin material having a high surface friction coefficient and elasticity to seal the space between the vacuum pad and the substrate.

The substrate transfer robot 320 may include a controller 360 to control the driving of each of the first hand 341 to the third hand 345. The controller 360 controls the first hand 341 to transfer the substrate before the liquid treatment process is performed, controls the third hand 345 to transfer a dried substrate, and controls the second hand 343 to transfer a substrate having a surface coated with a wetting solution.

In addition, the controller 360 controls the second hand 343 to transfer a substrate at a speed lower than the speed of transferring a substrate by the first hand 341 or the third hand 345. Accordingly, the second hand 343 may minimize that the wetting solution, which is coated on the surface of the substrate, is dropped down from the substrate in the process of transferring the substrate in the wet state, thereby preventing the substrate transfer apparatus from being contaminated.

Although an embodiment of the present disclosure has been described in that the first hand 341 to the third hand 345 are provided to one substrate transfer robot, the present disclosure is not limited. If necessary, three hands may be divided and provided to two substrate transfer apparatuses. In addition, the first hand and the third hand may be provided in a first substrate transfer apparatus, and the second hand may be provided in a second substrate transfer apparatus.

Hereinafter, a method for treating a substrate by using the substrate treating apparatus 1000 provided in the above-described substrate treating apparatus 1000 will be described, according to an embodiment of the resent disclosure.

Figure 5:
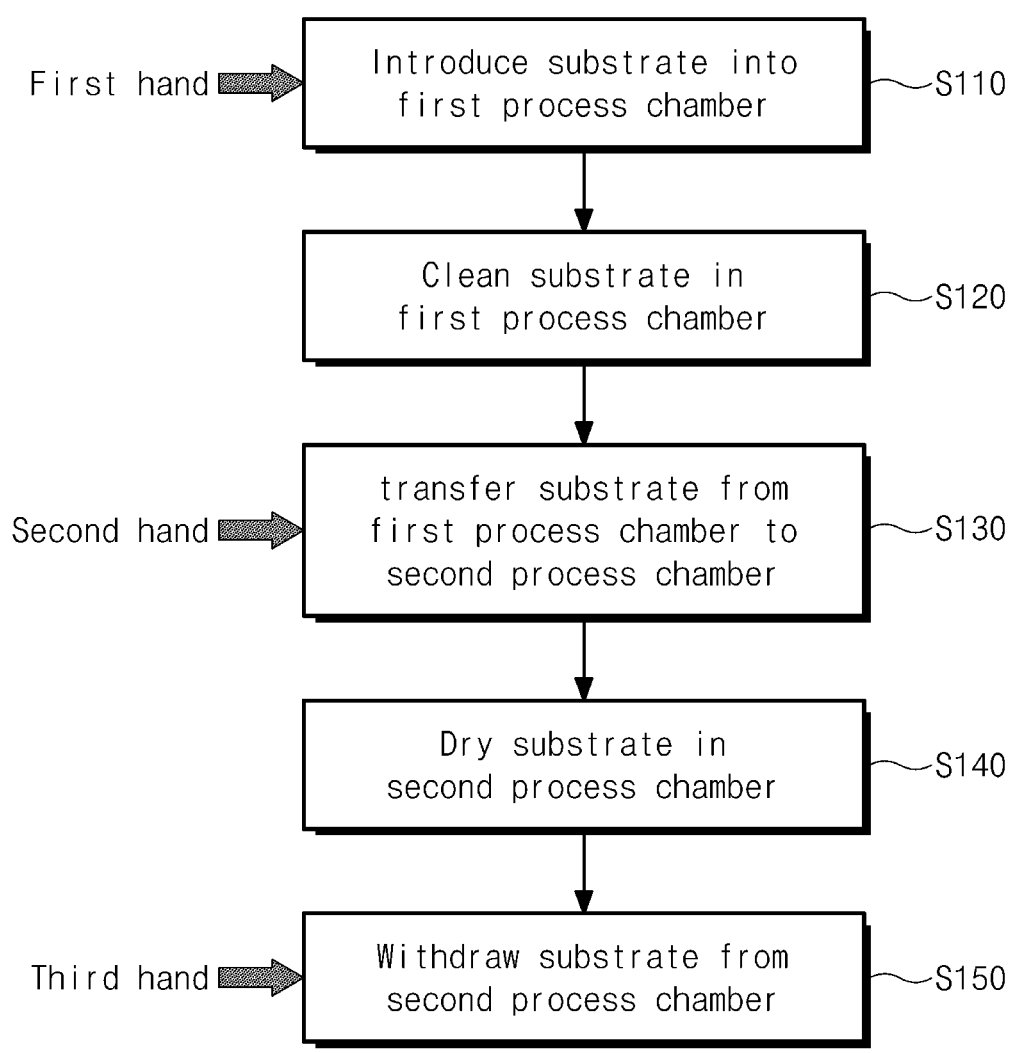
FIG. 5 is a flowchart illustrating a method for treating a substrate, according to an embodiment of the present disclosure.
Figure 6:
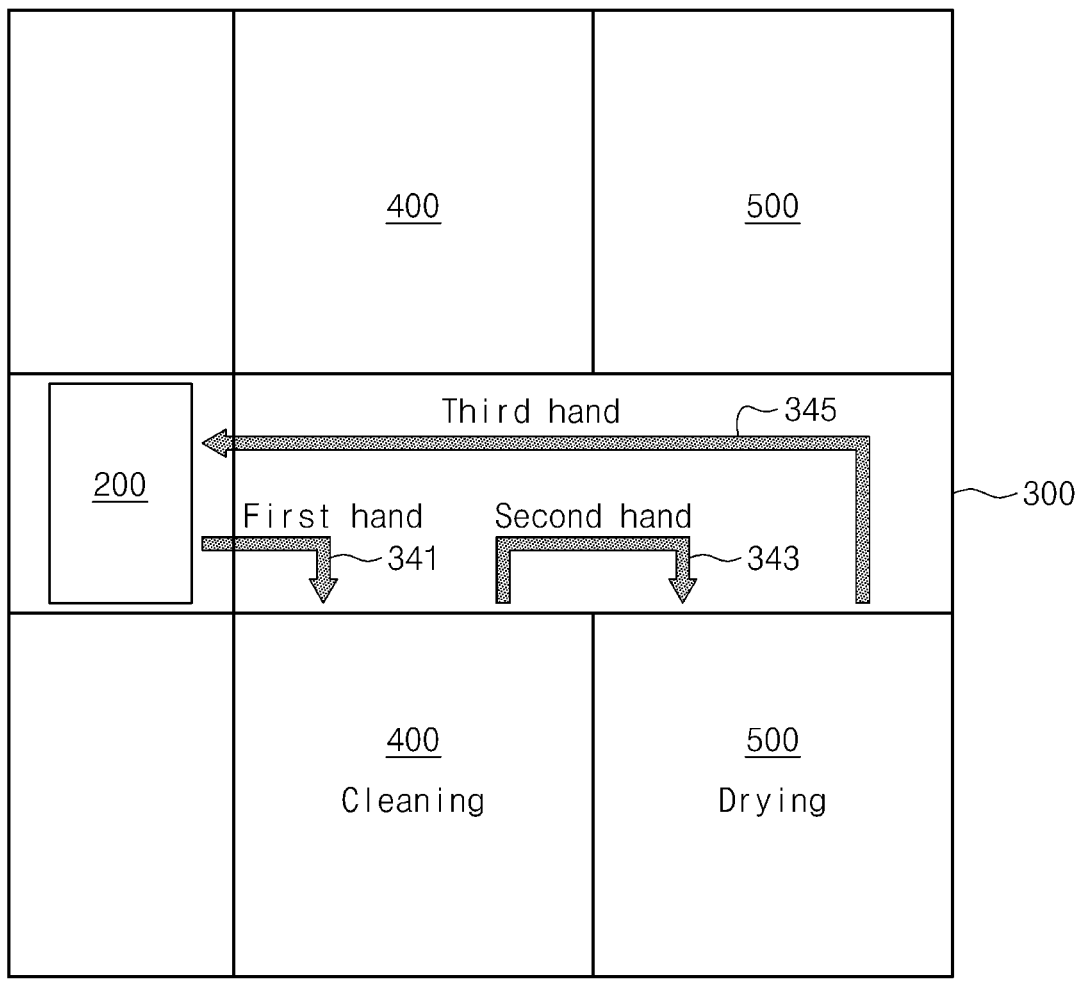
FIG. 6 is a view showing a path through which a substrate is transferred in the method for treating the substrate of FIG. 5.

FIG. 5 is a flowchart illustrating a method for treating a substrate, according to an embodiment of the present disclosure, and FIG. 6 is a view showing a path through which a substrate is transferred in the method for treating the substrate of FIG. 5.

According to the present disclosure, the method for treating the substrate is to clean and dry a substrate in a process treating unit.

The method for treating the substrate may include introducing a substrate (S110), cleaning the substrate (S120), transferring the substrate (S130), drying the substrate (S140), and withdrawing the substrate (S150).

In other words, in the introducing of the substrate (S110), the substrate is picked up by the first hand 341 and introduced into the first process chamber 400. In the cleaning of the substrate (S120), the liquid-treated substrate is withdrawn from the first process chamber 400 by the second hand 345 and introduced into the second process chamber 500. In this case, to prevent the surface of the substrate from being to be naturally dried while the substrate is moving between chambers, a wetting solution is coated on the surface of the substrate. The wetting solution may be coated before the substrate is transferred. Accordingly, the surface state of the substrate may be uniformly maintained to be a wet state during the transferring of the substrate from the first process chamber 400 to the second process chamber 500, or even after the substrate is transferred. For example, the wetting solution may include a volatile organic solvent (e.g., isopropyl alcohol, isopropyl alcohol aqueous solution), pure water, or a mixture of a surfactant and pure water. Then, the substrate, which is dried by using the supercritical fluid as the process fluid, is withdrawn from the second process chamber 500 by the third hand 345 and transferred into the buffer chamber.

Figure 7:
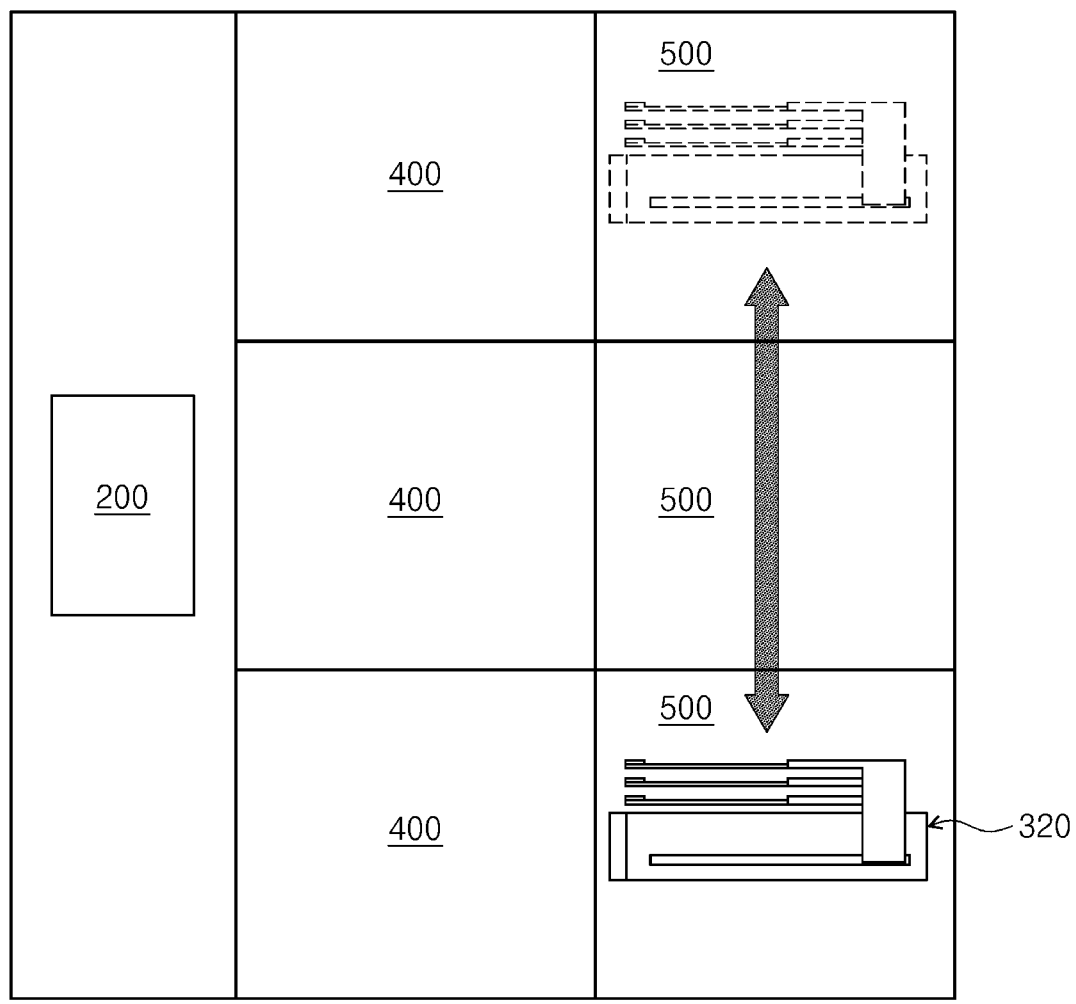
FIG. 7 is a side view of a process treating unit illustrated in FIG. 1.

FIG. 7 is a side view of a process treating unit illustrated in FIG. 1.

As illustrated in FIG. 7, the first process chamber 400 and the second process chamber 500 may be disposed on side surfaces of the transfer chamber 300. The substrate transfer robot 320 includes a body 330 and a first arm 342 to a third arm 346. The first arm 342 to the third arm 346 may be provided to be movable forward and backward on the body 330, and the body 330 may be provided to be rotatable about the third direction Z, and movable in the third direction Z. For example, three first process chambers 400 may be vertically stacked on each other, and three second process chambers 500 may be vertically stacked on each other. The number of the first process chambers 400 vertically stacked on each other is not limited there. Four or more, or two first process chambers 400 may be vertically stacked on each other. The number of the second process chambers 500 vertically stacked on each other is not limited there. Four or more, or two second process chambers 500 may be vertically stacked on each other. In FIG. 7, the transfer chamber (not shown) is behind the first and second process chambers.

Figure 8:
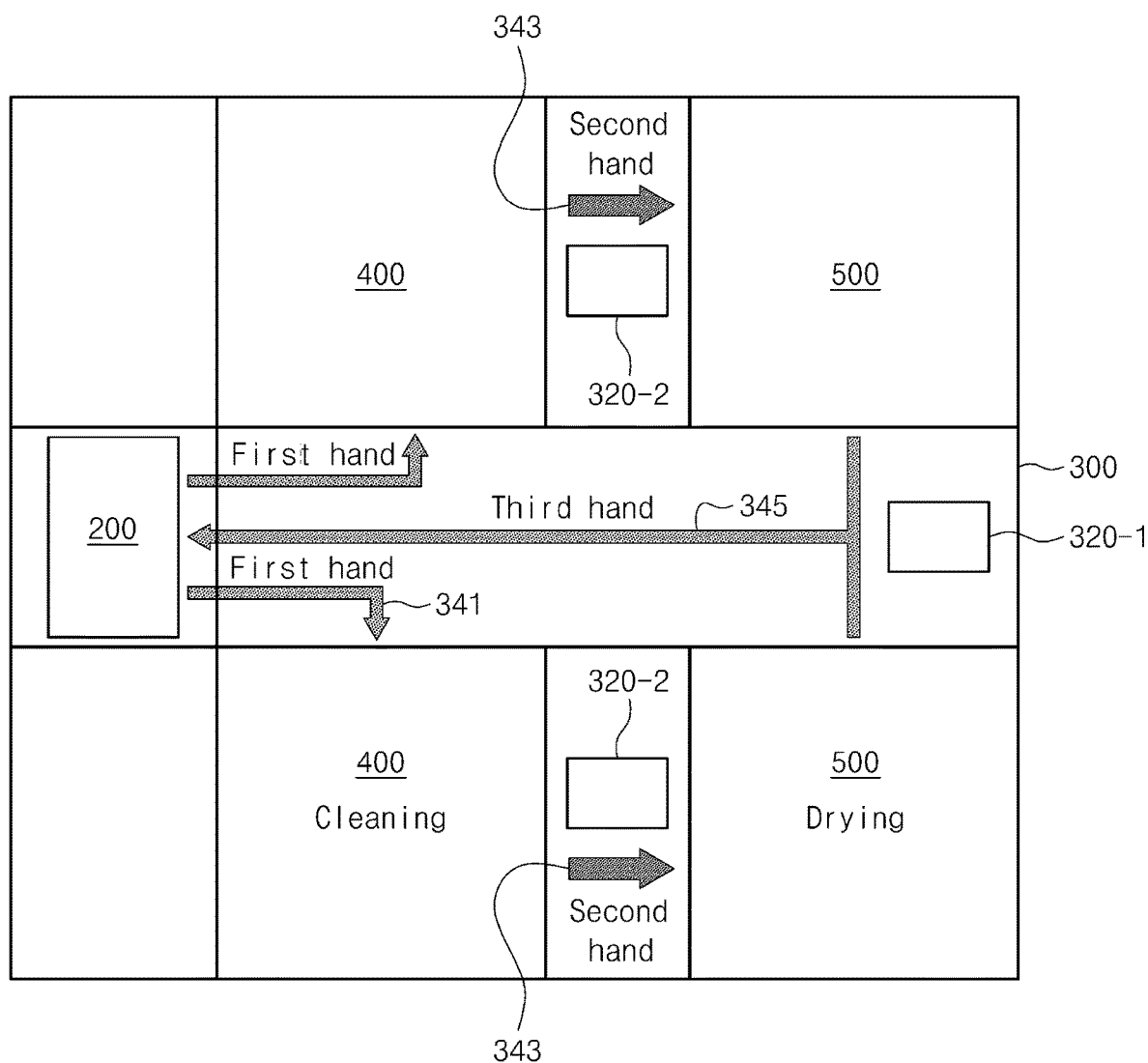
FIG. 8 is a view illustrating a substrate treating unit of an apparatus for treating a substrate, according to another embodiment.

FIG. 8 is a view illustrating a substrate treating unit of a substrate treating apparatus, according to another embodiment.

Referring to FIG. 8, a substrate treating unit 20a may further include a side substrate transfer apparatus 320-2 disposed between the first process chamber 400 and the second process chamber 500, in addition to the substrate transfer apparatus 320-1 disposed in the transfer chamber 300. In this case, the substrate transfer apparatus 320-1 may include the first hand 341 and the third hand 345, and the side substrate transfer apparatus 320-2 may include one second hand 343. For example, a separate transfer space for the side substrate transfer apparatus 320-2 may be interposed between the first process chamber 400 and the second process chamber 500.

The first hand 341 of the substrate transfer device 320-1 transfers a substrate to the first process chamber 40, before the liquid treatment process is performed, and the third hand 345 transfers the substrate dried in the second process chamber 500. In addition, the second hand 343 of the side substrate transfer apparatus 320-2 transfers the substrate having the surface, which is coated with the wetting solution in the first process chamber 400, to the second transfer chamber 500.

The above description has been made for the illustrative purpose. Furthermore, the above-mentioned contents describe an embodiment of the present disclosure, and the present disclosure may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the present disclosure, and various changes required in the detailed application fields and purposes of the present disclosure can be made. The written embodiment describes the best state for implementing the technical spirit of the present disclosure, and various changes required in the detailed application fields and purposes of the present disclosure can be made. Furthermore, it should be construed that the attached claims include other embodiments.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An apparatus for treating a substrate, the apparatus comprising:
   a first process chamber configured to perform a liquid treatment process on the substrate;
   a second process chamber configured to perform a drying treatment process on the substrate liquid-treated in the first process chamber;
   a substrate transfer robot including:
   a first hand configured to introduce the substrate to the first process chamber, before the liquid treatment process is performed,
   a second hand configured to withdraw the substrate from the first process chamber after the liquid treatment process is performed and to introduce the substrate into the second process chamber,
   a third hand configured to withdraw the substrate from the second process chamber after the drying treatment process is performed, and
   a body to which the first hand, the second hand, and the third hand are provided; and
   a controller configured to control individually driving each of the first hand, the second hand, and the third hand in a forward horizontal direction or in a backward horizontal direction extending along a horizontal straight line relative to an upper surface of the body,
   wherein the third hand, the first hand, and the second hand are disposed at different heights in a vertical direction on the body,
   wherein the first hand is disposed below the third hand,
   wherein the first hand and the third hand are disposed above the second hand which withdraws the substrate from the first process chamber after the liquid treatment process is performed, and
   wherein the controller is configured to:
   control the first hand to transfer the substrate before the liquid treatment process is performed,
   control the second hand to transfer the substrate having a surface coated with a wetting solution in the liquid treatment process,
   control the third hand to transfer the substrate which is dried, and
   control the second hand to transfer the substrate at a lower speed than a speed of transferring the substrate by the first hand or the third hand.

2. The apparatus of claim 1,
   wherein the second process chamber is configured to perform the drying treatment process on the substrate transferred from the first process chamber, by using a supercritical fluid or isopropyl alcohol (IPA).

3. The apparatus of claim 1,
   wherein the second hand is configured to transfer the substrate having the surface, which is coated with the wetting solution in the first process chamber, to the second process chamber.

4. The apparatus of claim 3,
   wherein the wetting solution includes a volatile organic solvent, pure water, a mixture of a surfactant, the volatile organic solvent, and the pure water, or a mixture of the surfactant and pure water.

5. The apparatus of claim 1, wherein the first hand and the third hand are provided in a first substrate transfer apparatus, and
wherein the second hand is provided in a second substrate transfer apparatus.

6. An apparatus for transferring a substrate, the apparatus comprising:
a body;
a first hand disposed on the body;
a second hand disposed on the body;
a third hand disposed on the body; and
a controller configured to control individually driving each of the first hand, the second hand, and the third hand in a forward horizontal direction or in a backward horizontal direction along a horizontal straight line relative to an upper surface of the body,
wherein the controller is configured to:
control the first hand to transfer the substrate before a liquid treatment process is performed,
control the third hand to transfer the substrate which is dried, and
control the second hand to transfer the substrate having a surface coated with a wetting solution in the liquid treatment process-,
wherein the third hand, the first hand, and the second hand are disposed at different heights in a vertical direction on the body,
wherein the first hand is disposed above the third hand, and
wherein the first hand and the third hand are disposed above the second hand for transferring the substrate which is coated with the wetting solution in the liquid treatment process.

7. The apparatus of claim 6,
wherein the controller is configured to:
control the second hand to transfer the substrate at a speed lower than a speed of transferring the substrate by the first hand or the third hand.

8. An apparatus for treating a substrate, the apparatus comprising:
a process treating unit configured to treat the substrate; and
an index unit including a load port on which a container having the substrate is placed, and an index robot to transfer the substrate between the container and the process treating unit,
wherein the process treating unit includes:
a transfer chamber having a substrate transfer apparatus to transfer the substrate to a destination and disposed adjacent to the index unit;
a first process chamber disposed at a first side of the transfer chamber to perform a liquid treatment process on the substrate received from the transfer chamber;
a second process chamber disposed at a second side of the transfer chamber to perform, by using a supercritical fluid or isopropyl alcohol (IPA), a drying treatment process on the substrate received from the first process chamber; and
a controller configured to:
control a first hand of the substrate transfer apparatus to transfer the substrate from the transfer chamber to the first process chamber before the liquid treatment process is performed;
control a second hand of the substrate transfer apparatus to transfer the substrate, which is coated with a wetting solution in the first process chamber, from the first process chamber to the second process chamber; and
control a third hand of the substrate transfer apparatus to withdraw the substrate which dried in the second process chamber from the second process chamber,
wherein the first hand is disposed below the third hand,
wherein the first hand and the third hand are disposed above the second hand to transfer the substrate coated with the wetting solution in the first process chamber,
wherein the controller is further configured to;
control individually driving each of the first hand, the second hand, and the third hand in a forward horizontal direction or in a backward horizontal direction, and
wherein the controller is further configured to:
control the second hand to transfer the substrate at a speed lower than a speed of transferring the substrate by the first hand or the third hand.

9. The apparatus of claim 8, wherein at least two of the first process chamber and the second process chamber are disposed to be stacked, and
wherein the substrate transfer apparatus has a body movable in an X-axis direction, a Y-axis direction, or a Z-axis direction.

10. The apparatus of claim 1, wherein the first process chamber and the second process chamber are disposed at opposite side portions of the transfer chamber or at the same side portion of the transfer chamber.

* * * * *